(12) United States Patent
Koga et al.

(10) Patent No.: US 7,405,448 B2
(45) Date of Patent: Jul. 29, 2008

(54) SEMICONDUCTOR DEVICE HAVING A RESISTANCE FOR EQUALIZING THE CURRENT DISTRIBUTION

(75) Inventors: Masuo Koga, Fukuoka (JP); Tetsuo Mizoshiri, Tokyo (JP); Yukimasa Hayashida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 109 days.

(21) Appl. No.: 11/538,232

(22) Filed: Oct. 3, 2006

(65) Prior Publication Data

US 2007/0284745 A1   Dec. 13, 2007

(30) Foreign Application Priority Data

Jun. 9, 2006   (JP)   ............................. 2006-160913

(51) Int. Cl.
H01L 23/62 (2006.01)
H01L 21/00 (2006.01)
H05K 7/20 (2006.01)

(52) U.S. Cl. ...................... 257/379; 257/706; 257/712; 257/720; 257/724; 257/E27.009; 361/709; 361/738; 361/782; 438/122; 438/125

(58) Field of Classification Search ........................ None
See application file for complete search history.

(56) References Cited

U.S. PATENT DOCUMENTS 5,488,256 A    1/1996   Tsunoda
5,536,972 A    7/1996   Kato
5,767,579 A    6/1998   Kanazawa et al.
6,201,696 B1*  3/2001   Shimizu et al. ............. 361/704
6,215,681 B1*  4/2001   Schuurman et al. ......... 363/141
7,304,370 B2* 12/2007   Imaizumi et al. ............ 257/666
2002/0066953 A1*  6/2002   Ishiwata et al. ............. 257/700
2003/0067748 A1*  4/2003   Tamba et al. ................ 361/699
2003/0168729 A1*  9/2003   Ishiwata et al. ............. 257/700

FOREIGN PATENT DOCUMENTS

JP   9-172140     6/1997
JP   2001-185679  7/2001

OTHER PUBLICATIONS

U.S. Appl. No. 11/538,232, filed Oct. 3, 2006, Koga et al.
U.S. Appl. No. 11/553,235, filed Oct. 26, 2006, Koga et al.

* cited by examiner

*Primary Examiner*—Alonzo Chambliss
(74) *Attorney, Agent, or Firm*—Oblon, Spivak, McClelland, Maier & Neustadt, P.C.

(57) ABSTRACT

A first insulating substrate is formed on a heat sink, and a semiconductor element is formed thereon. An insulating resin casing is formed so as to cover the first insulating substrate and the semiconductor element. A second insulating substrate is mounted inside the insulating resin casing apart from the first insulating substrate. On the second insulating substrate, a resistance element that functions as a gate balance resistance is fixed by soldering. The second insulating substrate on which the resistance element was thus mounted was made apart from the first insulating substrate on which the semiconductor element was mounted, and was mounted on the side of the insulating resin casing.

7 Claims, 4 Drawing Sheets

SEMICONDUCTOR DEVICE HAVING A RESISTANCE FOR EQUALIZING THE CURRENT DISTRIBUTION

BACKGROUND OF THE INVENTION

1. Field of the Invention

The present invention relates to a semiconductor device, and specifically to a semiconductor device on which a resistance is mounted to even out the current distribution to semiconductor elements of the semiconductor device.

2. Background Art

In a semiconductor device used in the inverter/converter of electric railways or the like, a rated current of several-hundred to several-thousand amperes is required. Therefore, several to several-ten semiconductor elements are normally connected in parallel in a semiconductor device.

For example, in Japanese Unexamined Patent Publication No. 2001-185679, the above-described semiconductor device, which has a plurality of semiconductor elements formed on an insulating substrate, is disclosed. On the insulating substrate, a resistance known as a gate balance resistance is disposed in the vicinity of each semiconductor element. The resistance is to even out the current distribution to each semiconductor device, and is fixed on the insulating substrate by soldering similarly to the semiconductor element. Furthermore, the insulating substrate is fixed on the heat sink by soldering.

When the above-described semiconductor element is in operation, a heat cycle occurs. Consequently, in the soldered portion, thermal stress caused by difference of coefficients of linear thermal expansion of each constituting member is generated, and the solder is gradually cracked. When the portion where the gate balance resistance is soldered is cracked, there has been a problem wherein the resistance value is elevated, and finally open-circuit defect is caused to generate withstand voltage defect.

SUMMARY OF THE INVENTION

The present invention has been developed to solve the above-described problems, and therefore it is an object of the present invention to provide a semiconductor device that can prevent open-circuit defect of the gate balance resistance generated in the operation of the semiconductor device and can secure high reliability.

The above object is achieved by a semiconductor device that includes a heat sink, a first insulating substrate formed on the heat sink in contact with the heat sink, a semiconductor element formed on the first insulating substrate, an insulating resin casing formed on the heat sink and surrounding the first insulating substrate and the semiconductor element, a second insulating substrate mounted inside the insulating resin casing apart from the heat sink and the above the first insulating substrate above the heat sink, a resistance element fixed on the second insulating substrate by soldering, and a wire electrically connecting the semiconductor element to the resistance element.

According to the present invention, a semiconductor device that can prevent open-circuit defect of the gate balance resistance generated in the operation of the semiconductor device and can secure high reliability can be obtained.

Other features and advantages of the invention will be apparent from the following description taken in connection with the accompanying drawings.

DETAILED DESCRIPTION OF THE PREFERRED EMBODIMENTS

Figure 1A:
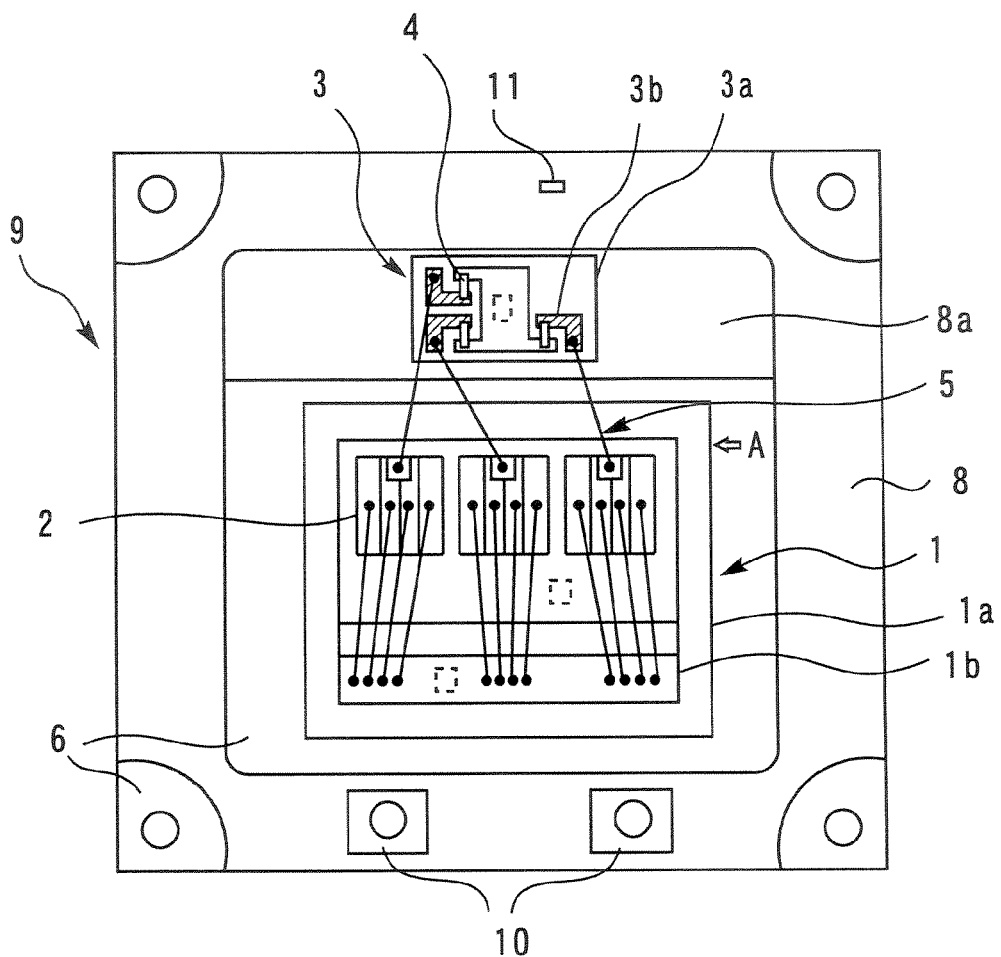
FIG. 1A is a plane view of a semiconductor device of the first embodiment.

Embodiments of the present invention will be described below referring to the drawings. In the drawings, the same or equivalent parts will be denoted by the same reference numerals, and the description thereof will be simplified or omitted.

First Embodiment

Figure 1B:
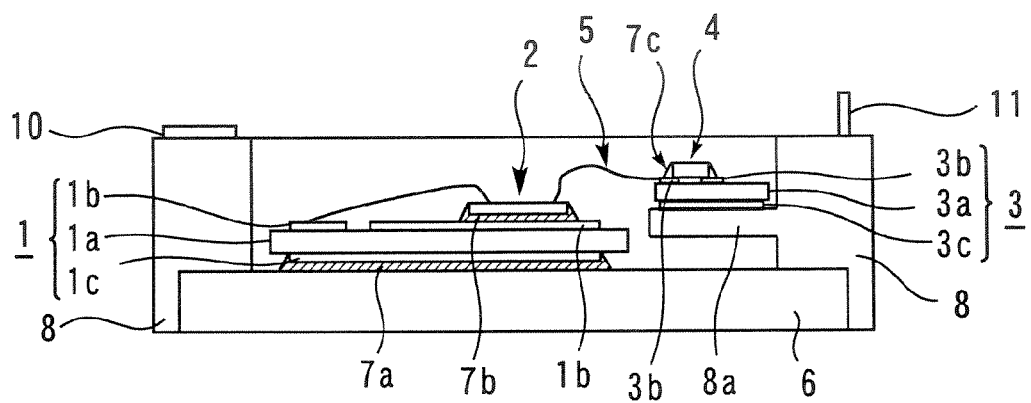
FIG. 1B is a side view of the semiconductor device shown in FIG. 1A.

A semiconductor device according to the first embodiment will be described. FIG. 1A is a plane view of the semiconductor device according to the present invention; and FIG. 1B is a side view of the semiconductor device viewed from the A direction in FIG. 1A. The semiconductor device is equipped with a heat sink 6 composed of a metal, such as copper and aluminum, and a first insulating substrate 1 is formed on the heat sink 6. The first insulating substrate 1 has a first insulating layer 1a, a first conductive pattern 1b, and a first back face pattern 1c. The first conductive pattern 1b is formed on the upper surface of the first insulating layer 1a, and the first back face pattern 1c is formed on the lower surface of the first insulating layer 1a. The first insulating layer 1a is composed of a ceramic, such as AlN (aluminum nitride), and the first conductive pattern 1b and the first back face pattern 1c, which are joined to the first insulating layer 1a, are formed of copper or a copper alloy.

The first back face pattern 1c is fixed on the upper surface of the heat sink 6 through via solder 7a. Thus, the first insulating substrate 1 is formed on the heat sink 6. On the first conductive pattern 1b, a semiconductor element 2, such as an IGBT and a power MOSFET, is formed. The first conductive pattern 1b is electrically connected to the semiconductor element 2 via solder 7b. Thus, the semiconductor element 2 is formed on the first insulating substrate 1.

An insulating resin casing 8 is formed so as to surround the first insulating substrate 1 fixed on the heat sink 6, and equipped with the heat sink 6 and the semiconductor element 2. The insulating resin casing 8 has insert-molded main terminals 10 and a control terminal 11, and electrical connection to the conductive pattern and the like on the insulating substrate is constituted through lead portions (not shown) extending from the main terminals 10 or control terminal 11 into the casing 8.

A protruding portion 8a is formed on the inner wall of the insulating resin casing 8, and a second insulating substrate 3 is mounted thereon. Specifically, above the heat sink 6, the second insulating substrate 3 is mounted on the inner wall of the insulating resin casing 8, apart from the heat sink 6 and the first insulating substrate 1.

The second insulating substrate 3 has a second insulating layer 3a, second conductive patterns 3b, and a second back face pattern 3c. The second conductive patterns 3b are formed on the upper surface of the second insulating substrate 3a, and the second back face pattern 3c is formed on the lower surface of the second insulating substrate 3. Similar to the first insulating substrate 1, the second insulating layers 3a in the second insulating substrate 3 are composed of a ceramic, such as AlN, and the second conductive patterns 3b and the second back face pattern 3c, which are joined to the second insulating layer 3a, are formed of copper or a copper alloy.

A plurality of second conductive patterns 3b are formed, and a resistance element 4 is formed so as to stride across the pattern adjacent the second conductive patterns 3b. The second conductive patterns 3b are connected to the resistance element 4 by solder 7c. Specifically, the second conductive patterns 3b are electrically connected to the resistance element 4 by soldering. Thus, the resistance element 4 having a predetermined resistance value is fixed on the second insulating substrate 3 by soldering.

The second back face pattern 3c is fixed on the upper surface of the protruding portion 8a by an adhesive or the like. Thus, the second insulating substrate 3 is mounted on the inner wall of the insulating resin casing 8. Furthermore, the semiconductor element 2 is connected to the second conductive patterns 3b by a wire 5. Thereby, the semiconductor element 2 is connected to the resistance element 4 through the wire 5 and the second conductive patterns 3b. For a method for mounting (fixing) the second insulating substrate 3 on the insulating resin casing 8, although the second back face pattern 3c was mounted on the protruding portion 8a using an adhesive, a structure wherein the second back face pattern 3c is engaged with the second insulting substrate 3 and fixed (fitted) to the protruding portion 8a in the insulating resin casing 8 can be used. Since such a structure is formed in the step for forming the insulating resin casing 8, and the use of the adhesive is not required, the costs of the product can be reduced.

The operation of each semiconductor element 2, specifically the switching operation of each switching element, such as an IGBT and a power MOSFET is performed by applying ON/OFF control (switching) signals to each gate electrode. At this time, by setting the resistance value of the resistance element 4 connected to each semiconductor element 2 to a predetermined value, the gate current flowing to each semiconductor element can be adjusted. Specifically, the resistance element 4 functions as a gate balance resistance for balancing the gate current.

Figure 2:
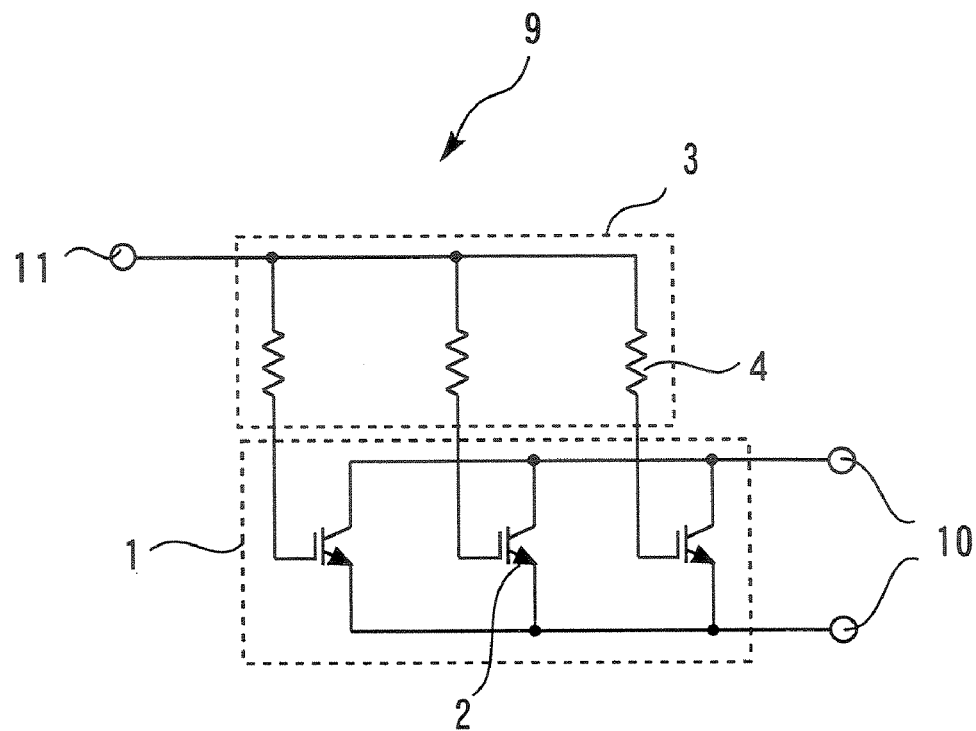
FIG. 2 is a circuit diagram of a semiconductor device of the first embodiment.

Although detailed description will be omitted, in a semiconductor device, to protect the insulating substrates or the semiconductor element, the space surrounded by the insulating resin casing 8 is filled with silicon gel so that the first insulating substrate 1 and the second insulating substrate 3 including the semiconductor element 2 and the wire 5 is covered, and further, the upper portion thereof is sealed by coating with an epoxy resin or covering with a lid. To facilitate the understanding of the present invention, the circuit diagram of a semiconductor device 9 in the embodiments of the present invention is shown in FIG. 2.

As described above, in the semiconductor device of the first embodiment, an insulating substrate having a second insulating substrate 3, namely a gate balance resistance mounted thereon is fixed to the insulating resin casing side. By the above-described structure, heat generated when the semiconductor element 2 is operated is little transmitted to the resistance element 4. Thereby, compared with conventional art, the occurrence of cracks in solder 7c connecting the second insulating substrate 3 to the resistance element 4 can be suppressed. Therefore, the open defect of the gate balance resistance portion occurring in the operation of the semiconductor element can be prevented, and high reliability can be secured.

Also as described above, the resistance element 4 is fixed on the second insulating substrate 3 by soldering. The soldering can be realized by reflow soldering using a hot plate. Specifically, since no operation using a soldering iron is required, the workability of soldering can be improved. Furthermore, the quality of the semiconductor device can be stabilized.

According to the semiconductor device of the first embodiment, the open defect of the gate balance resistance portion occurring in the operation of the semiconductor element can be prevented, and high reliability can be secured.

Second Embodiment

A semiconductor device according to the second embodiment will be described. Here, the description will be focused around aspects different from the first embodiment.

In a conventional art, a semiconductor element 2 and a resistance element 4 were formed on the same insulating substrate. Consequently, the insulating substrate required an insulation resistance to several thousands of volts. However in the first embodiment, an insulating substrate on which a gate balance resistance had been mounted was fixed on the side of the insulating resin casing. Therefore, it is considered to be sufficient if the insulating substrate has an insulation resistance to several tens of volts. For this reason, the second embodiment has a structure wherein the thickness of the insulating layer in the insulating substrate on which a gate balance resistance is mounted is thinner than the thickness of the insulating layer in the insulating substrate on which a semiconductor device is mounted.

Figure 3:
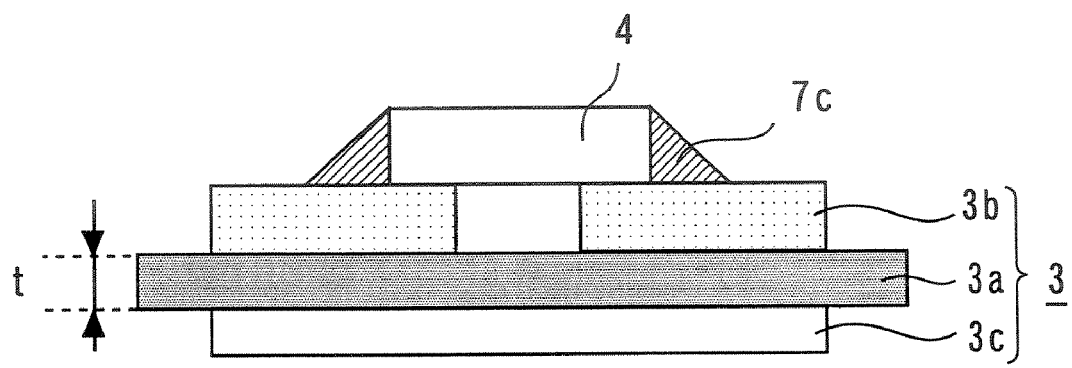
FIG. 3 is a side view of a second insulating substrate and a resistance element of a semiconductor device of the second embodiment.

FIG. 3 is a side view of a second insulating substrate 3 and a resistance element 4 in the semiconductor device according to the second embodiment. In the second embodiment, the thickness t of the second insulating layer 3a in the second insulating substrate 3 is thinner than the thickness of the first insulating layer 1a in the first insulating substrate 1.

For example, when the thickness of the first insulating layer 1a is about 0.64 mm, even if the thickness of the second insulating layer 3a is about 0.32 mm, the insulation resistance is secured, and no problems arise. Specifically, the thickness of the second insulating layer 3a can be thinner by about 0.32 mm than the thickness of the first insulating layer 1a, which is half the thickness of the first insulating layer 1a.

Thus, the thickness of the second insulating layer 3a in the second insulating substrate 3 is thinner than the thickness of the first insulating layer 1a in the first insulating substrate 1. Other configurations are the same as the configurations in the first embodiment. By using the above-described configurations, the second insulating substrate 3 for mounting the resistance element 4 can be fabricated in lower costs.

According to the semiconductor device of the second embodiment, in addition to the effect of the first embodiment, the insulating substrate to mount the resistance element can be fabricated in lower costs, and cost reduction can be achieved.

Third Embodiment

A semiconductor device according to the third embodiment will be described. Here, the description will be focused around aspects different from the first and second embodiments.

Figure 4A:
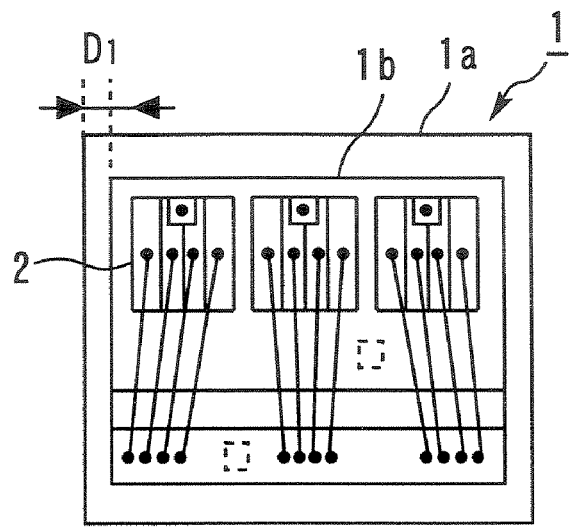
FIG. 4A is a plane view of a first insulating substrate of a semiconductor device of the third embodiment.
Figure 4B:
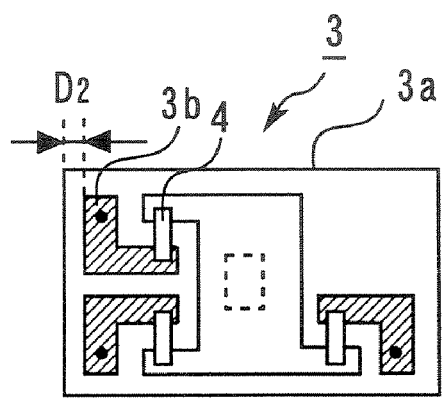
FIG. 4B is a plane view of a second insulating substrate of a semiconductor device of the third embodiment.

The plane views of the first insulating substrate 1 and the second insulating substrate 3 of a semiconductor device according to the third embodiment are shown in FIGS. 4A and 4B, respectively. In FIG. 4A, the shortest distance from the periphery of the first conductive pattern 1b to the periphery of the first insulating layer 1a along the surface of the first insulating layer 1a, namely the creeping distance from the first conductive pattern 1b to the periphery of the first insulating layer 1a is represented by $D_1$. In FIG. 4B, the shortest distance from the periphery of the second conductive pattern 3b to the periphery of the second insulating layer 3a along the surface of the second insulating layer 3a, namely the creeping distance from the second conductive pattern 3b to the periphery of the second insulating layer 3a is represented by $D_2$.

At this time, in the third embodiment, the creeping distance $D_2$ is shorter than the creeping distance $D_1$. For example, $D_1$ is 2 mm and $D_2$ is 0.5 mm. Other configurations are the same as the configurations in the first and second embodiments.

In the third embodiment, in the same manner as in the first and second embodiments, an insulating substrate on which a gate balance resistance had been mounted was fixed on the side of the insulating resin casing. Therefore, it is considered to be sufficient if the insulating substrate has an insulation resistance to several tens of volts. Consequently, the creeping distance $D_2$ can be shorter than the creeping distance $D_1$. Thereby, the second insulating substrate 3 for mounting the resistance element 4 can be fabricated in further low costs, and cost reduction can be achieved.

According to the semiconductor device of the third embodiment, in addition to the effects of the first and second embodiments, the insulating substrate to mount the resistance element can be fabricated in further low costs, and cost reduction can be achieved.

Fourth Embodiment

A semiconductor device according to the fourth embodiment will be described. Here, the description will be focused around aspects different from the first to third embodiments.

Figure 5:
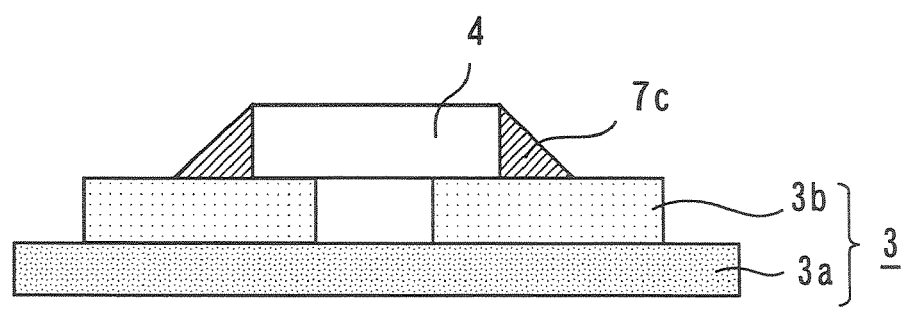
FIG. 5 is a side view of a second insulating substrate of a semiconductor device of the fourth embodiment.

A sectional view of the second insulating substrate 3 of a semiconductor device according to the fourth embodiment is shown in FIG. 5. In the structure of the first to third embodiments, the second back face pattern 3c was formed on the lower surface of the second insulating layer 3a, and was fixed on the protruding portion 8a (refer to FIG. 1B). Whereas, in the structure of the fourth embodiment, as FIG. 5 shows, the second back face pattern 3c was not formed on the lower surface of the second insulating layer 3a.

Figure 6:
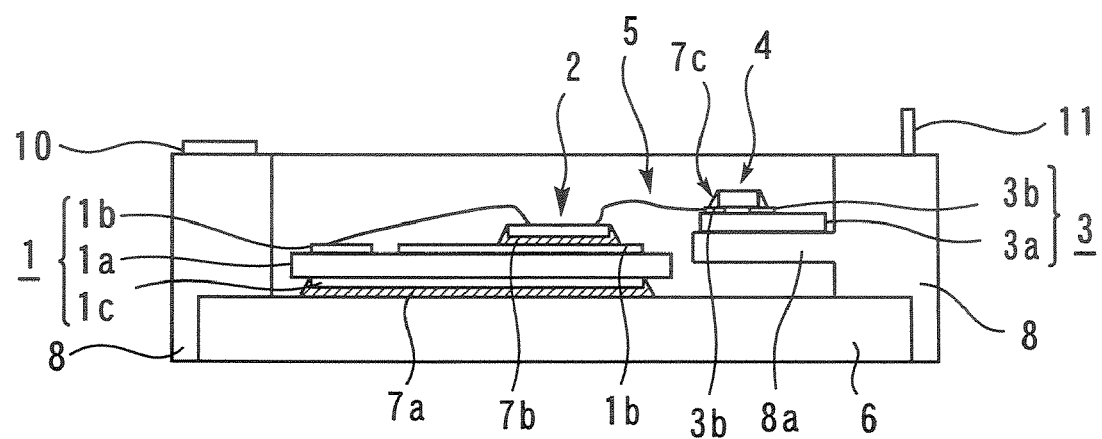
FIG. 6 is a side view of a semiconductor device of the fourth embodiment.

A semiconductor device using such a second insulating substrate is shown in FIG. 6. Specifically, the semiconductor device of the fourth embodiment has a structure wherein a second insulating substrate 3 is mounted inside the insulating resin casing 8 by directly fixing the second insulating layer 3a to the insulating resin casing 8 (the upper surface of the protruding portion 8a) with an adhesive.

Using the above-described structure, since the back face pattern of the second insulating substrate 3 becomes unnecessary, the second insulating substrate 3 to mount the resistance element 4 can be fabricated in further low costs, and cost reduction can be achieved.

According to the semiconductor device of the fourth embodiment, in addition to the effects of the first and third embodiments, the insulating substrate to mount the resistance element can be fabricated in further low costs, and cost reduction can be achieved. In the second insulating substrate 3 having a second back face pattern 3c, since the phenomenon wherein noise generated by the switching operation of the semiconductor element 2 is overlapped with the second conductive pattern 3b of the second insulating substrate 3 can be suppressed, the effect to stabilize the operation and improve the reliability of the semiconductor device can be obtained.

Fifth Embodiment

A semiconductor device according to the fifth embodiment will be described. Here, the description will be focused around aspects different from the first to fourth embodiments.

In first to fourth embodiments, examples wherein ceramics composed of AlN or the like were used as the material of the second insulating layer 3a of the second insulating substrate 3 were shown. In the fifth embodiment, a glass epoxy resin was used as the material described above. Other configurations are the same as the configurations in the first to fourth embodiments.

Also in the fifth embodiment, in the same manner as in the first to fourth embodiments, an insulating substrate on which a gate balance resistance was mounted was fixed on the insulating casing side. Therefore, as the material for the insulating layer of the second insulating substrate 3, a material having lower insulation resistance and heat resistance than the material for the insulating layer of the first insulating substrate 1 can be used.

By using the above-described structure, the second insulating substrate 3 to mount the resistance element 4 can be fabricated in further low costs, and cost reduction can be achieved.

According to the semiconductor device of the fifth embodiment, in addition to the effects of the first to fourth embodiments, the insulating substrate to mount the resistance element can be fabricated in further lower costs, and cost reduction can be achieved.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2006-160913, filed on Jun. 9, 2006 including specification, claims, drawings and summary, on which the Convention priority of the present application is based, are incorporated herein by reference in its entirety.

The invention claimed is:

1. A semiconductor device comprising:
   a heat sink,
   a first insulating substrate formed on said heat sink in contact with said heat sink,
   a semiconductor element formed on said first insulating substrate,
   an insulating resin casing formed on said heat sink and surrounding said first insulating substrate and said semiconductor element,
   a second insulating substrate mounted inside said insulating resin casing apart from said heat sink and said first insulating substrate above said heat sink,
   a resistance element fixed on said second insulating substrate by soldering, and a wire electrically connecting said semiconductor element to said resistance element.

2. The semiconductor device according to claim 1, wherein said first insulating substrate has a first insulating layer, and a first conductive pattern formed on the upper surface of said first insulating layer;

said first conductive pattern is electrically connected to said semiconductor element;

said second insulating substrate has a second insulating layer, and a second conductive pattern formed on the upper surface of said second insulating layer; and said second conductive pattern is electrically connected to said resistance element by said soldering.

3. The semiconductor device according to claim 2, wherein the thickness of said second insulating layer of said second insulating substrate is thinner than the thickness of said first insulating layer of said first insulating substrate.

4. The semiconductor device according to claim 2, when
the shortest distance from said first conductive pattern to the circumference of said first insulating layer is a first creeping distance, and
the shortest distance from said second conductive pattern to the circumference of said second insulating layer is a second creeping distance,
said second creeping distance is shorter than said first creeping distance.

5. The semiconductor device according to claim 3, when
the shortest distance from said first conductive pattern to the circumference of said first insulating layer is a first creeping distance, and
the shortest distance from said second conductive pattern to the circumference of said second insulating layer is a second creeping distance,
said second creeping distance is shorter than said first creeping distance.

6. The semiconductor device according to claim 2, wherein second insulating substrate further has a back surface pattern formed on the lower surface of said second insulating layer.

7. The semiconductor device according to claim 2, wherein said second insulating layer of said second insulating substrate is composed of a glass epoxy resin.

* * * * *